United States Patent [19]

Baumgartl

[11] Patent Number: 5,546,081
[45] Date of Patent: Aug. 13, 1996

[54] ANALOG-TO-DIGITAL CONVERTER CIRCUIT HAVING HIGH DYNAMICS

[75] Inventor: Rudi Baumgartl, Dormitz, Germany

[73] Assignee: Siemens Aktiengesellschaft, Munich, Germany

[21] Appl. No.: 250,532

[22] Filed: May 31, 1994

[30] Foreign Application Priority Data

Jun. 9, 1993 [DE] Germany .......................... 43 19 256.4

[51] Int. Cl.⁶ .................................................. H03M 1/18
[52] U.S. Cl. ........................................... 341/139; 341/155
[58] Field of Search ..................................... 341/138, 139, 341/155

[56] References Cited

U.S. PATENT DOCUMENTS 4,851,842   7/1989   Iwamatsu ................................ 341/139
5,124,707   6/1992   Stove ..................................... 341/157

FOREIGN PATENT DOCUMENTS 3816903   4/1993   Germany .
1742985   6/1992   U.S.S.R. .

Primary Examiner—Jeffrey A. Gaffin
Assistant Examiner—Thomas Granger
Attorney, Agent, or Firm—Hill, Steadman & Simpson

[57] ABSTRACT

For converting a high-frequency analog signal, which is modulated by a modulation signal, an analog-to-digital converter circuit included a first analog-to-digital converter which is preceded by an amplifier having controllable gain, and which is followed by a controllable divider. A quantization unit generates control signals from the analog input signal for setting the gain of the controllable gain amplifier and for setting the divisor of the controllable divider. The quantization unit includes a second analog-to-digital converter which digitizes the analog input signal a rate approximately corresponding to the sampling rate of the first analog-to-digital converter. The second analog-to-digital converter is followed by a rectification unit which rectifies the signal digitized by the second converter. The rectification unit is followed by a coder which generates an output which increases with increasing momentary amplitude of the rectified signal. The coder is followed by a peak value detector, which is reset at a rate which is above the Nyquist frequency of the modulation signal, and which delivers a control signal to the amplifier and to the divider until the coder generates a higher output signal, which then causes a new control signal to be substituted for the previous control signal.

4 Claims, 2 Drawing Sheets

ANALOG-TO-DIGITAL CONVERTER CIRCUIT HAVING HIGH DYNAMICS

BACKGROUND OF THE INVENTION

1. Field of the Invention

The present invention is directed to an analog-to-digital converter circuit, and in particular to an analog-to-digital converter circuit for digitization a high-frequency analog signal which is amplitude-modulated by a modulation signal.

2. Description of the Prior Art

An analog-to-digital converter circuit is disclosed in U.S. Pat. No. 4,851,842 which has an analog input to which an analog high-frequency signal can be supplied. The circuit includes an analog-to-digital converter unit which is connected to the analog input via an amplifier with a controllable gain, the analog-to-digital converter having a digital output connected to a controllable divider. The divider is controlled by a control signal which digitally divides the digital output of the converter by an amount which is a reciprocal of the gain of the amplifier unit. This control signal is supplied by a quantization unit, which is also supplied with the analog input signal, and which selects a control signal, which in turn selects the gain of the amplifier (and the divisor of the divider) dependent on the amplitude of the analog input signal.

High-frequency signals in the megahertz range, having high dynamics of up to 96 dB occur, for example, as echo signals in magnetic resonance systems (MR systems). The signal processing in the reception channel of such MR systems is therefore complicated. The dynamics of the reception signal are dependent on various parameters such as, for example, the weight of a patient, the slice position wherein a tomogram is to be produced, the type of pulse sequence which is employed, the type of reception antenna, etc. A digitization of the reception signal in conventional MR systems ensues only following an analog demodulation. In order to provide the desired dynamics in the digital output signal, this requires that high-resolution analog-to-digital converters of, for example, 16 bits and having a sampling rate of 500 kHz, be used. In order to optimally drive the demodulator and the analog-to-digital converter, a receiver adjustment is also undertaken before each measurement, which results in a presetting of the level of the reception signal. This presetting ensues in test measurements. A digitization of the reception signal as early as possible in the receiver chain would be desirable, preferably before a demodulation. If this were accomplished, a reception signal could then be digitally further-processed, at least beginning with an intermediate frequency level. Moreover, if the digitization could ensue with high dynamics, the aforementioned receiver adjustment would be superfluous, and the overall time which a patient must spend in the examination apparatus would be shortened.

The analog-to-digital circuit disclosed in the aforementioned U.S. Pat. No. 4,851,842 is for the purpose of improving the digitization of small signals in the audio range. As described in the that patent, the accuracy of the analog-to-digital conversion is poorest in the lower significant bits of the digital output signal, however, for small signals the total digital output signal may not have many places above the lower significant bits. This results in a relatively high signal-to-noise ratio in conventional analog-to-digital converters. The circuit disclosed in U.S. Pat. No. 4,851,842 is intended to prevent a deterioration of the signal-to-noise ratio in the digitization of small signals, and the range of dynamics of the overall digital-to-analog conversion is thus enhanced. This is effected by the use of a controllable amplifier which precedes the actual digital-to-digital analog unit, and by a controllable divider following the analog-to-digital converter unit. The amplifier and the divider respectively amplify and divide by factors which are reciprocal. The control signal, which sets the gain of the amplifier and the divisor of the divider, is generated dependent on the envelope of the analog input signal which is to be digitized. The known circuit disclosed in U.S. Pat. No. 4,851,842, however, is not suitable for analog-to-digital conversion of signals having frequencies in the megahertz range, as arise in diagnostic magnetic resonance technology.

SUMMARY OF THE INVENTION

It is an object of the present invention to provide an analog-to-digital converter circuit which is capable of digitizing amplitude-modulated high-frequency analog signals in the megahertz range, of the type arising in diagnostic magnetic resonance systems, with a high dynamics.

The above object is achieved in accordance with the principles of the present invention in an analog-to-digital circuit having an analog-to-digital converter preceded by a controllable gain amplifier and followed by a controllable divider, with a quantizer which provides control signals to the amplifier and divider, and wherein the quantizer includes a further analog-to-digital converter which digitizes the analog input signal at a rate approximately corresponding to the sampling rate of the initially identified analog-to-digital converter. In the quantizer, the further analog-to-digital converter is followed by a rectification unit which digitally rectifies the signal from the further analog-to-digital converter. The rectification unit is followed by a coder which generates an output signal dependent a range into which the momentary amplitude of the analog signal falls, the amplitude being exhibited by the corresponding digitized signal from the further analog-to-digital converters. The coder is followed in the quantizer by a peak value detector which supplies the control signal from its output to the amplifier and divider. The peak value detector is reset at a rate which is above the Nyquist frequency of the modulation signal. If the coder has not generated a higher output signal within the reset period, the peak value detector, upon being reset, continues to supply the same control signal at its output. If, within a reset period, the coder supplies a higher output, the peak value detector supplies a new control signal at its output upon its next resetting.

The circuit arrangement of the invention allows an amplitude-modulated, high-frequency analog signal of, for example, 2.5 MHz, as occurs as an intermediate frequency signal in diagnostic magnetic resonance systems, to be digitized with a sampling rate of 20 MHz and with a resolution of 16 bits. Dynamics of 96 dB can be achieved with a 16 bit digitization. As a consequence of the preceding amplifier and the following divider, a commercially available 12 bit analog-to-digital converter can be used as the initially identified analog-to-digital converter. Due to the high dynamics achieved by the digital-to-analog converter circuit of the invention, the circuit can be employed in magnetic resonance systems without the need for conducting a receiver adjustment of the type described above. The time which the patient must spend in the examination unit is thus shortened. The quantizer is matched to the limit frequency of the baseband signal, and can be realized with conventional components.

3

In a further embodiment of the invention, the values (amplitude values) of the respective discrete control signals differ from control signal-to-control signal by a factor of 2, and the divider is a barrel shifter. This simple embodiment of the divider can be utilized when the gain of the amplifier can be set exactly and with high consistency.

DESCRIPTION OF THE PREFERRED EMBODIMENTS

Figure 1:
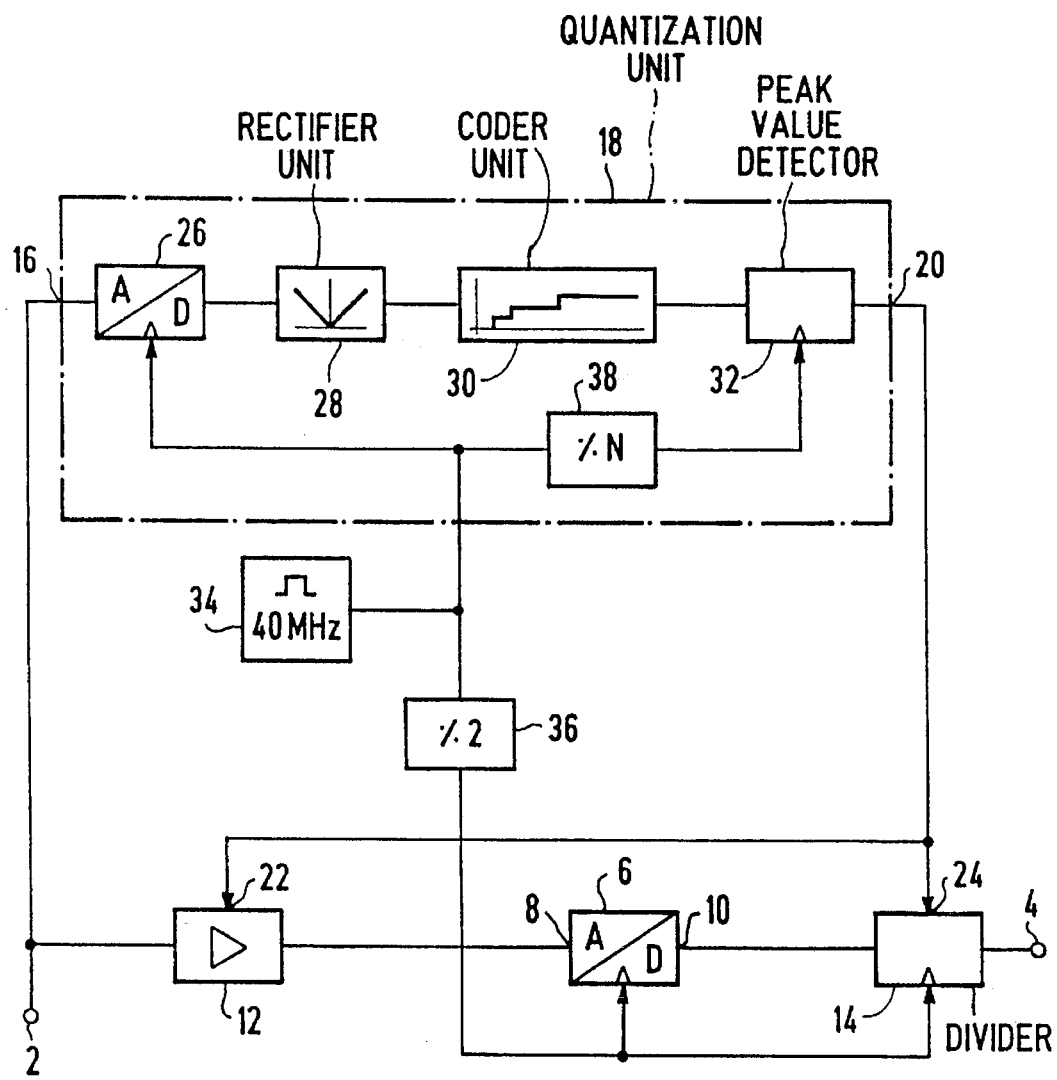
FIG. 1 is a block circuit diagram of a first embodiment of an analog-to-digital converter circuit constructed in accordance with the principles of the present invention.

The embodiment of the circuit shown in FIG. 1 includes an analog input 2, to which an analog high-frequency signal can be supplied. The circuit is designed to digitize an analog high-frequency signal which is amplitude-modulated with a modulation signal, for example, a high-frequency analog signal having a carrier frequency of 2.5 MHz, modulated by a modulation signal having an upper limit frequency of 250 kHz. The amplitude-modulated, high-frequency analog signal supplied to the analog input 2 is digitized within the analog-to-digital converter circuit showing FIG. 1 with dynamics of 16 bits in two's complement, at a sampling rate of 20 MHz. The circuit has a digital output 4 at which the digitized signal is present.

The analog-to-digital conversion occurs in an analog-to-digital converter unit 6 having an analog unit input 8 and a digital unit output 10. The digitization ensues with a lower bit resolution, such as 12 bits, than the signal which is present at the digital output 4. The analog unit input 8 is connected to the analog input 2 of the circuit via a controllable amplifier 12. The digital unit output 10 is connected to the circuit digital output 4 via a controllable digital divider 14. The divider 14 may be a barrel shifter.

An input 16 of a quantization unit 18 is also connected to the analog input 2. The quantization unit 18 allocates the momentary amplitudes of the high-frequency analog signal to a plurality of discrete amplitude values, and supplies control signals at a control output 20 dependent on these discrete amplitude values. The quantization unit 18 does not quantize the momentary values of the high-frequency analog signal, but instead allocates a control signal to different ranges of the amplitudes of the high-frequency signal. The control signals which are supplied at the output 20 can therefore change only when a difference between successive amplitudes is so large that they are allocated to different ranges, which in turn define different control signals. The amplitude values are prescribed by the modulation signal. Signals containing three bits, with which a maximum of eight different amplitude values can be identified, are sufficient. The control output 20 is connected to an amplifier control input 22 and a divider control input 24. In the amplifier 12, a gain is allocated to each control signal such that, for each discrete amplitude value, there exists a highest amplitude which can be digitized barely avoiding distortion by the analog-to-digital unit 6 after that highest amplitude is amplified by the amplifier unit 12. Additionally, each control signal selects in the divider 14 a divisor which is the reciprocal of the gain selected in the amplifier unit 12, for use in the divider 14. The effect of the gain in the digitized high-frequency signal is thus cancelled by the divider 14.

The gains in the amplifier unit 12 are in five steps of 6 dB, which permits a particularly simple structure of the divider 14. If the amplifier unit 12 has gains of 1 (which corresponds to an unamplified transmission of the high-frequency analog signal from the analog input 2 to the analog unit input 8), 2, 4, 8 and 16, this permits the divider 14 to attenuate the signal digitized by the analog-to-digital converter unit 6 by factors of 1 (i.e., no attenuation), ½, ¼, ⅛, 1/16. The effect of the amplification is thus cancelled by the digital divider 14. The digitized output signal thus has a constant number of counting bits, respectively corresponding to the bit resolution of the analog-to-digital converter 6. This results in a lower resolution at high amplitudes than at low amplitudes, however, this is not disturbing in practice.

The quantization unit 18 includes an analog-to-digital converter 26 having a rough resolution of 8 bits over the entire range of amplitudes of the modulation signal. The analog-to-digital converter 26 samples at 40 MHz in order to acquire the peak values of the high-frequency oscillations, i.e., the amplitudes, with sufficient precision without a subsequent filter. The signal digitized by the analog-to-digital converter 6 is supplied to a rectification unit 28, and from the rectification unit 28 to a Lin-$Log_2$ coder 30. The Lin-$Log_2$ coder 30 implements a quantization of the digitized, momentary values of the high-frequency signal, with these momentary values from prescribed ranges being allocated to different amplitude values in the output signal of the coder 30. The graduation is logarithmically selected relative to the base 2, so that the output of the coder 30 moves to a next-higher amplitude value each time the input signal at the Lin-$Log_2$ coder 30 doubles. The quantized output signal of the coder 30 is supplied to a peak value detector 32, which is periodically reset. If, in the period between successive resettings, the input signal to the peak value detector 32 has not assumed a higher amplitude value, the peak value detector 32 continues to supply the same control signal at the output 20. If the amplitude of the input to the peak value detector 32 increases during a resetting period, the control signal supplied at the output 20 is correspondingly changed at the next resetting, so as to appropriately adjust the gain and the divisor, respectively, of the amplifier 12 and the divider 14. In order for the peak value 32 to recognize the expected amplitude changes, i.e., the modulation signal, it must be reset at a rate which is at least twice the upper limit frequency of the modulation signal, i.e., a rate which is higher than the Nyquist frequency associated with the modulation signal.

The clock control of the analog-to-digital converter circuit proceeds from a clock generator 34, which generates a 40 MHz clock signal. The clock signal is supplied to the analog-to-digital converter 26, and to two dividers 36 and 38. The divider 36 halves the clock frequency to 20 MHz for controlling the analog-to-digital converter 6 and the divider 14. The divider 38 divides the clock signal from the clock generator 34 by N (in this case, N=40) for controlling the peak value detector 32, so that in the embodiment of FIG. 1 the peak value detector 32 is reset at a rate of 1 MHz. The peak value detector 32 is thus reset at a rate which is above the Nyquist frequency of the sampled signal, so that no information is lost.

When the amplitudes of the high-frequency signal to be digitized are in a range between 90 dB and 96 dB, the peak value detector 32, for example, supplies output control signals for a 0 dB gain and 0 dB attenuation at the output 20. The analog-to-digital converter unit 6 digitizes the unamplified momentary values with 12 bits. The 12 most significant bit places are occupied in the 16-bit signals, which are present at the output 4, and the four-least significant places are filled with zeroes.

When the amplitudes are a the range from 84 dB through 90 dB, i.e., when they are in a range of ¼ through ½ of the maximum amplitude, a control signal setting a gain of 6 dB for the amplifier 12 and an attenuation by 6 dB for the divider 14 is present at the output 20. The analog-to-digital converter unit 6 is thus again optimally operated. The 12 bit signal which is preset at the unit output 10 is incorporated in the 16 bit signal by being shifted toward the right by one place in the divider 14, which is the digital equivalent of dividing by two. The most significant bit place having the operational sign and the three least-significant bit places are thus occupied with zeroes in the 16 bit signal. Given even lower amplitudes, a correspondingly higher gain is set for the amplifier 12, and a shift farther toward the right of the 12 bit signal is undertaken in the divider 14.

Figure 2:
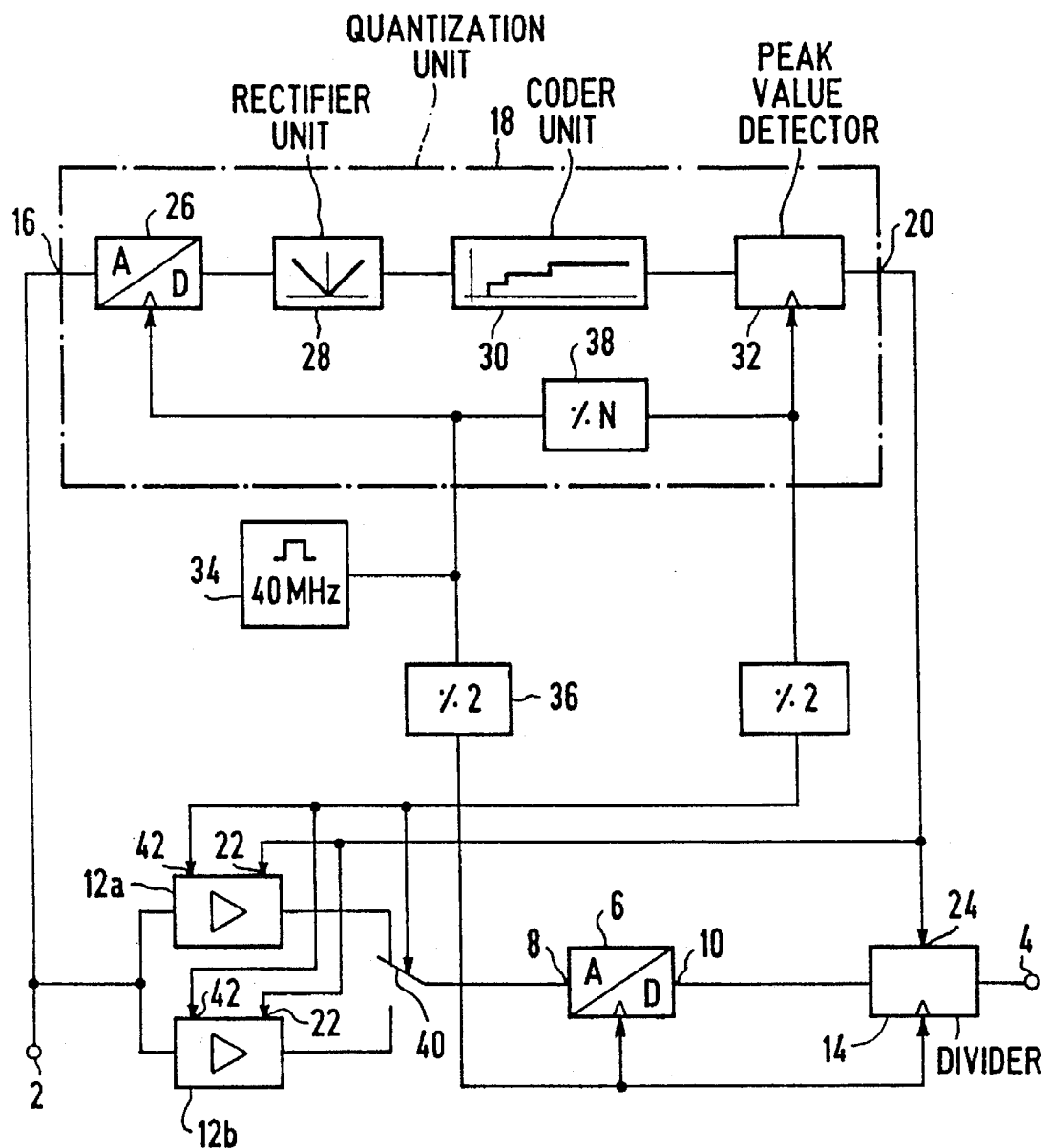
FIG. 2 is a block circuit diagram of a further embodiment of an analog-to-digital converter circuit constructed in accordance with the principles of the present invention, having two amplifiers which are activated in alternation.

High demands with respect to the transient response are made on the amplifier 12. If the amplifier components respond too slowly to operate at a newly set gain value, the analog-to-digital converter unit 6 would digitize a distorted signal. Lower demands can be made of the transient response of the components in the amplifier 12 in an embodiment shown in FIG. 2, wherein two amplifiers 12a and 12b are connected in parallel, instead of one amplifier 12. The respective outputs of the amplifiers 12a and 12b are connected via a switch 40 to the unit input 8 of the analog-to-digital converter unit 6. The switch 40 is switched in alternation at rate which is one-half of the output of the divider 38. The amplifiers 12 and 12b are also enabled (activated) at a clock rate which is one-half of the output of the divider 38, a clock signal at this rate being supplied to the amplifiers 12a and 12b at respective enable inputs 42. The respective outputs of the amplifiers 12a and 12b are thus supplied in alternation to the unit input 8 of the analog-to-digital converter 6 by the switch 40, with the amplifier which is not connected to the analog-to-digital converter unit 6 being enabled for switching the gain thereof, whereas the amplifier which is connected to the analog-to-digital converter unit 6 is prevented from having its gain switched. Given the switch position of the switch 40 shown in FIG. 2, the amplifier 12b is enabled for switching its gain.

Although modifications and changes may be suggested by those skilled in the art, it is the intention of the inventor to embody within the patent warranted hereon all changes and modifications as reasonably and properly come within the scope of his contribution to the art.

I claim as my invention:

1. A circuit for digitizing a high-frequency analog signal modulated by a modulation signal, said analog signal having amplitudes and said modulation signal having a Nyquist frequency associated therewith, said circuit comprising:

an analog input to which said analog signal is supplied;

an amplifier unit connected to said analog input, said amplifier unit having a controllable gain, settable among a plurality of gains by a control signal;

first analog-to-digital means, having an input connected to an output of said amplifier unit, for sampling said analog signal, amplified by said amplifier unit, at a sampling rate for converting said analog signal amplified by said amplifier unit into a corresponding first digital signal;

controllable divider means, supplied with said first digital signal, for digitally dividing said first digital signal by a divisors set from among a plurality of divisors which are respectively reciprocals of said gains in said plurality of gains, said controllable divider being supplied with said control signal for setting said divisor; and quantizer means, connected to said analog input, for generating said control signal dependent on the amplitude of said analog signal, said quantizer means including second analog-to-digital converter means, supplied with said analog signal, for sampling said analog signal at a rate approximating said sampling rate of said first analog-to-digital converter means, for converting said analog signal into a second digital signal, means for digitally rectifying said second digital signal to produce a rectified signal, said rectified signal exhibiting rectified corresponding to said amplitudes of said analog signal, coder means supplied with said rectified signal for generating a coder output having an amplitude from among a plurality of discrete amplitudes, each having an amplitude range associated therewith, dependent on which of said amplitude ranges said amplitude of said rectified signal falls within, and peak value detector means, reset at a rate which is above said Nyquist frequency of said modulation signal, said reset rate defining a reset period, for supplying said control signal to said amplifier unit and said divider for respectively setting a gain and a divisor therein which are reciprocal, said coder means supplying said control signal for a reset period and supplying a control signal allocated to a higher amplitude range upon a resetting of said peak value detector if said output of said coder means increases.

2. A circuit as claimed in claim 1 wherein said amplifier unit comprises an amplifier unit having a plurality of gains respectively differing by a factor of 2, and wherein said divider comprises a barrel shifter.

3. A circuit as claimed in claim 1 wherein said coder means comprises a Lin-Log$_2$ coder having an output signal corresponding to an input signal logarithmized relative to the base two.

4. A circuit as claimed in claim 1 wherein said amplifier unit comprises first and second amplifiers having respective outputs connectable to said input of said first analog-to-digital converter means via a switch; and means for operating said switch to connect the respective outputs of said amplifiers in alternation to said input of said first analog-to-digital converter means and means for prohibiting a change in the setting of the gain of an amplifier when that amplifier is connected to said input of said first analog-to-digital converter means.

* * * * *